(12) United States Patent
Hirai et al.

(10) Patent No.: US 6,720,077 B2
(45) Date of Patent: Apr. 13, 2004

(54) RESIN COMPOSITION, AND USE AND METHOD FOR PREPARING THE SAME

(75) Inventors: Yasuyuki Hirai, Oyama (JP); Hironori Suzuki, Shimodate (JP); Yoshiyuki Takeda, Shimodate (JP); Kenichi Oohori, Shimodate (JP); Shinichi Kamoshida, Shimodate (JP); Minoru Kakitani, Shimodate (JP); Norihiro Abe, Shimodate (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/073,309

(22) Filed: Feb. 13, 2002

(65) Prior Publication Data

US 2002/0155298 A1 Oct. 24, 2002

(30) Foreign Application Priority Data

Feb. 15, 2001 (JP) .......................................... 2001-38553

(51) Int. Cl.$^7$ .................. B32B 27/38; B32B 27/04; C09K 21/12; C09L 63/00
(52) U.S. Cl. ................. 428/416; 428/413; 428/414; 428/418; 428/901; 528/87; 528/88; 523/400; 523/435; 252/601; 252/609
(58) Field of Search ............... 528/87, 88, 99, 528/119, 120, 121; 523/400, 435, 451; 252/601, 609; 428/413, 414, 416, 418, 901

(56) References Cited

U.S. PATENT DOCUMENTS

| 6,180,695 | B1 | * | 1/2001 | Ito et al. ..................... 523/451 |
| 6,291,626 | B1 | * | 9/2001 | Wang et al. ................... 528/99 |
| 6,524,709 | B1 | * | 2/2003 | Sagara et al. ................ 428/413 |

* cited by examiner

Primary Examiner—Robert Dawson
Assistant Examiner—Michael J Feely
(74) Attorney, Agent, or Firm—Antonelli, Terry, Stout & Kraus, LLP

(57) ABSTRACT

The present invention relates to a resin composition containing an epoxy resin, an amine-type curing agent, an organophosphorus compound having a structure represented by formula 1 and an organic solvent, wherein the epoxy resin and the organophosphorus compound has been compounded at a temperature of 50° C. or lower. The resin composition has enough flame retardancy without containing any halogen-containing flame retarder, has good heat resistance and good chemical resistance, and causes no problems with respect to reaction stability or curability caused by consumption of an epoxy resin through a reaction occurring during compounding of the resin composition.

37 Claims, No Drawings

RESIN COMPOSITION, AND USE AND METHOD FOR PREPARING THE SAME

TECHNICAL FIELD

The present invention relates to a resin composition, an electrically insulating prepreg, laminate and printed-wiring board using the resin composition, and methods for their production. The laminate referred to in the present invention includes a laminate one or both surfaces of which are clad with a metal foil, namely a metal-clad laminate.

BACKGROUND ART

In recent years, because of increasing concern about environmental problems, prepregs, laminates and printed-wiring boards for electrical insulation have been desired to release no harmful substances to the environment during their disposal or incinerate. Therefore, for the prevention of the so-called dioxin problem during their incinerate, the number of products characterized by containing no halogen-containing flame retarder is increasing. As a flame retarder that can substitute for the halogen-containing flame retarder, flame retarders of metal hydroxide type, phosphorus type, melamine-modified resin type and so on are employed and, especially, phosphorus-containing flame retarders are useful because a great flame retarding effect can be obtained by their use even in a small amount.

However, compounds practically used as a phosphorus-containing flame retarder include red phosphorus, phosphoric acid salts, phosphoric esters and so on. They have problems such as releasing harmful phosphine gas during their incinerate or reducing heat resistance or chemical resistance of laminates, printed-wiring boards and the like through their hydrolysis. With respect to such problems, JP-A Nos. 4-11662 and 2000-80251 disclose a reaction product resulting from an epoxy resin and an organophosphorus compound having a structure different from phosphoric esters and containing in its molecule a phenolic hydroxyl group capable of reacting easily with an epoxy resin. It is reported that this reaction product does not reduce heat resistance or chemical resistance and that flame-retardant resin compositions, laminates and printed-wiring boards containing no halogen-containing flame retarders can be produced using that reaction product. However, with respect to the reaction product resulting from an epoxy resin and an organophosphorus compound having a phenolic hydroxyl group disclosed in those patent publications, both of the epoxy resin and the organophosphorus compound are polyfunctional and, therefore, crosslinking structure easily occurs in the reaction product, it is very difficult to control their reactivity. Further, since an epoxy group is consumed when the epoxy resin and the organophosphorus compound react together, there are problems, with the reaction product, of having a very large epoxy equivalent and having a reduced curability.

Under these circumstances, an object of the present invention is to provide a resin composition that has enough flame retardancy without containing any halogen-containing flame retarder, has good heat resistance and good chemical resistance, and causes no problems with respect to reaction stability or curability caused by consumption of an epoxy resin through a reaction occurring during compounding of the resin composition. Another object of the present invention is to provide a prepreg, laminate and printed-wiring board using this resin composition and to provide methods for their production.

DISCLOSURE OF THE INVENTION

The inventors of the present invention investigated earnestly to attain the above objects and have found the invention below. That is, the present invention is directed to a resin composition comprising:

an epoxy resin, an amine-type curing agent, an organophosphorus compound having a structure represented by formula 1:

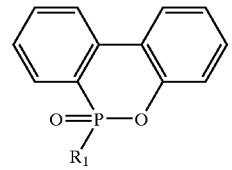

Formula 1

Wherein R1 is an aryl radical with two hydroxyl groups, and the aryl radical can be substituted by one to three lower alkyls, preferably R1 is one of the radical selected from the group:

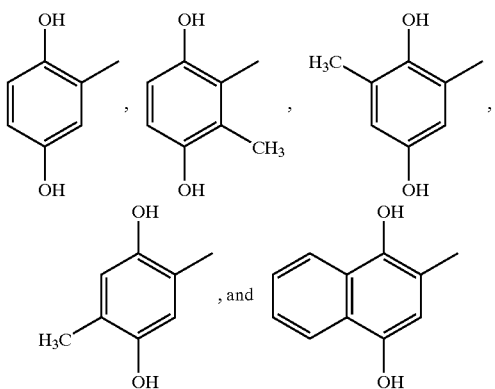

and an organic solvent, wherein the epoxy resin and the organophosphorus compound have been compounded at a temperature of 50° C. or lower. Further, the present invention is also directed to a prepreg, laminate and printed-wiring board using this resin composition, and to methods for their production.

BEST MODE FOR CARRYING OUT THE INVENTION

The resin composition of the present invention is characterized by being a composition in which a reaction between the epoxy resin and the organophosphorus compound represented by formula 1 is inhibited until the resin composition is used for preparation of prepregs. If a reaction between the epoxy resin and the organophosphorus compound represented by formula 1 occurs during their compounding, the epoxy equivalent weight will change, resulting in a large variation in gelation time of the resin and an unstable curability. To control the reactivity of the two ingredients during their compounding, it is necessary to keep the temperature at 50° C. or lower during the compounding step. Whether a reaction is taking place between the epoxy resin and the organophosphorus compound can be confirmed using a general-purpose analyzer such as high-performance liquid chromatography.

Examples of the epoxy resin contained in the resin composition of the present invention include bisphenol A-type epoxy resin, bisphenol F-type epoxy resin, bisphenol S-type epoxy resin, biphenyl-type epoxy resin, naphthalenediol-type epoxy resin, phenol-novolak-type epoxy resin, cresol-novolak-type epoxy resin, alicyclic epoxy resin, glycidyl ester resin, glycidyl amine resin, heterocyclic epoxy resin such as triglycidylisocyanurate and diglycidylhydantoin, and modified epoxy resins resulting from modification of these epoxy resins with various reactive monomers. Tetrakis(glycidyloxyphenyl)ethane can also be employed.

These epoxy resins can be used alone or, alternatively, two or more kinds of epoxy resins can be employed in suitable combination. Especially, phenol-novolak-type epoxy resin, cresol-novolak-type epoxy resin and dicyclopentadiene-modified novolak epoxy resin are preferable because high heat resistance and high reliability are required for electric and electronic material applications. It is desirable to use at least one of the three types of epoxy resins in an amount of 30 wt % or more versus the combined amount of the whole epoxy resin.

Examples of the amine-type curing agent that can be used include open-chain aliphatic amine such as ethylenediamine, diethylenetriamine, triethylenetetramine, tetraethylenepentamine, hexamethylenediamine, diethylaminopropylamine, dicyandiamide, tetramethylguanidine and triethanolamine; alicyclic amine such as isophoronediamine, diaminodicyclohexylmethane, bis(aminomethyl)cyclohexane, bis(4-amino-3-methyldicyclohexyl)methane, N-aminoethylpiperazine and 3,9-bis(3-aminopropyl)-2,4,8,10-tetraoxaspiro[5.5]undecane; and aromatic amine such as xylenediamine, phenylenediamine, diaminodiphenylmethane and diaminodiphenylsulfone.

These amine-type curing agents can be used alone or, alternatively, two or more kinds of amine-type curing agents can be employed in suitable combination. Especially, dicyandiamide is preferable from the viewpoints of curability and physical properties of cured products.

Examples of the organophosphorus compound having a structure represented by formula 1 include 10-(2,5-dihydroxyphenyl)-9,10-dihydro-9-oxa-10-phosphaphenanthrene-10-oxide, 10-(2,5-dihydroxy-6-methylphenyl)-9,10-dihydro-9-oxa-10-phosphaphenanthrene-10-oxide, 10-(2,5-dihydroxy-3-methylphenyl)-9,10-dihydro-9-oxa-10-phosphaphenanthrene-10-oxide, 10-(2,5-dihydroxy-4-methylphenyl)-9,10-dihydro-9-oxa-10-phosphaphenanthrene-10-oxide, and 10-(1,4-dihydroxy-2-naphthyl)-9,10-dihydro-9-oxa-10-phosphaphenanthrene-10-oxide. Especially, 10-(2,5-dihydroxyphenyl)-9,10-dihydro-9-oxa-10-phosphaphenanthrene-10-oxide is preferable from the viewpoint of flame retardancy.

The compounding ratio of the epoxy resin, the amine-type curing agent, the organophosphorus compound having the structure represented by formula 1 and the organic solvent can be determined from the viewpoint of proper maintenance of the properties of cured products resulting from curing these ingredients, especially, heat resistance, hygroscopicity and flame retardancy. The amount of the amine-type curing agent compounded is from 0.3 to 0.6 equivalent per epoxy groups of the epoxy resin. The organophosphorus compound having the structure represented by formula 1 is preferably compounded in an amount of from 5 to 30 wt % in the organic solids excluding the organic solvent and the inorganic components.

The equivalent of the amine-type curing agent is defined by the molar number of active hydrogen bonding to the nitrogen atom present per mol of the curing agent. For example, when an amine-type curing agent is dicyandiamide, 1 mol is considered to be 4 equivalents.

Compounding of the amine-type curing agent in an amount within the aforementioned range permits cured products to have enough crosslinking density and also to have controlled hygroscopicity. It, therefore, can result in the avoidance of problems concerning blister of a metal foil having thereon a circuit formed in a printed-wiring board manufacturing process, interlayer delamination and so on.

If the organophosphorus compound having the structure represented by formula 1 is compounded in an amount within the above-mentioned range, good flame retardancy can be exhibited. Further, since unreacted products do not remain in cured products during a molding and curing process, chemical resistance can be maintained.

With respect to the kind and amount of the organic solvent, any solvent can be used without any particular limitations if the epoxy resin and the amine-type curing agent constituting the resin composition can be homogeneously dissolved therein and the solvent has a viscosity and volatility proper for the preparation of prepregs. Particularly, methyl ethyl ketone, 2-methoxyethanol, 2-methoxypropanol, 1-methoxy-2-propanol and the like, which satisfy the above requirements, are preferable from the viewpoints of price, handlability and safety. The organic solvent is preferably used in an amount of from 10 to 50 wt % versus the total amount of the resin composition including the organic solvent.

Further, in the resin composition of the present invention, the epoxy resin and the amine-type curing agent may forgo phase separation to precipitate and the amine-type curing agent after the volatilization of the organic solvent during the production of prepregs depending on the kinds of the epoxy resin and the amine-type curing agent. In such a case, it is very probable that no uniformly cured products can be obtained when the resin composition as received is molded and cured. Therefore, a resin composition which can yield a uniformly cured product can be obtained by allowing an epoxy resin and an amine-type curing agent to react in an organic solvent at a temperature of from 80 to 140° C. before compounding a composition, thereby bringing the two components into a state where the two components are mutually compatible in the absence of a solvent. It seems that the reason for this is that a bond is partially formed between an epoxy group of the epoxy resin and an amino group of the amine-type curing agent and the bond serves as a compatibilizer for these components. From the viewpoint of productivity, it is preferable for productivity that the reaction temperature is within that range because a sufficient reaction rate can be achieved and one can control the reaction. Further, in this step, a reaction accelerator can optionally be added. If an organophosphorus compound having the structure represented by formula 1 is added to such a mixture, the organophosphorus compound is added at a temperature of 50° C. or lower after the reaction between the epoxy resin and the amine-type curing agent has been carried out.

The resin composition of the present invention can be prepared by holding the compounding temperature at 50° C. or lower in the step of compounding the organophosphorus compound represented by formula 1. The reaction between the epoxy resin and the organophosphorus compound of formula 1 proceeds when a reaction catalyst is added and the system is heated to 100° C. or higher as described in JP-A No. 1992-11662. However, even if the temperature is lower than 100° C., the reaction proceeds slowly. If the temperature at which the two components are compounded is held at 50° C. or lower, the reaction between the two components can be almost completely prohibited. Whether the reaction between the two components has proceeded or not can be confirmed using a general-purpose analyzer such as high-performance liquid chromatography. In the production method provided in the present invention, the reaction ratio, that is, the ratio of the amount of the organophosphorus compound that has reacted to the amount of the organophosphorus compound added is 0.5% or less.

To improve the flame retardancy, to enhance the rigidity or to reduce thermal expansion, the resin composition of the present invention can contain an inorganic filler. From necessity of achieving these purposes and limitation of maintaining adhesion and processability of laminates or printed-wiring boards to be produced from the resin composition, the content of the inorganic filler is preferably from 10 to 50 wt % versus the total amount of solid components excluding the organic solvent, that is, the resin solid components including the inorganic filler. The inorganic filler is not particularly limited and may be any non-halogen compound that does not deteriorate any property of laminates or printed-wiring boards, such as silica, talc, mica, aluminum oxide, magnesium carbonate and barium carbonate. Inorganic filler can be used alone or, alternatively, two or more kinds of inorganic fillers can be used in combination. Especially, aluminum hydroxide, which serves to improve flame retardancy, is preferable. It is most preferable to add aluminum hydroxide in an amount of from 10 to 50 wt %. To further improve the flame retardancy, it is effective to cover part of the inorganic fillers to be added with a molybdenum or zinc compound, and preferably with zinc molybdate, which combines advantages of both compounds.

The resin composition of the present invention may contain a flame retarder, a pigment, an adhesive aid, an antioxidant, and a curing accelerator and so on besides the above-mentioned ingredients. As such additives, known compounds can be employed. For example, various kinds of imidazoles (e.g., 2-ethyl-4-methylimidazole) can be used as the curing accelerator. Any non-halogen compound that does not deteriorate properties of laminates or printed-wiring boards can be employed in any content without any particular limitations.

A prepreg can be prepared by impregnating a substrate such as glass cloth with the resin composition of the present invention and drying. Further, a laminate can be manufactured by arranging a metal foil on the prepreg, and heating and pressurizing them to laminate together. Furthermore, it is also possible to manufacture a printed-wiring board by removing an unnecessary part of the laminate by etching. In the manufacture of the prepreg, laminate and printed-wiring board, the processes of coating, laminating and circuit processing usually employed in the art can be applied. The employment of these processes enables laminates and printed-wiring boards to possess high heat resistance, high flame retardancy and high reliability and containing no halogen-containing flame retarders.

EXAMPLES

The present invention will be described in more detail by reference to examples and comparative examples of the present invention below. The invention, however, is not limited to the examples.

In the examples and comparative examples, as an epoxy resin, an amine-type curing agent, an organophosphorus compound represented by the formula 1 and other compounds compounded, the products listed below were employed. As for the glass cloth, copper foil and the like for constituting laminates and prepregs, materials usually employed in the chemical industry and electronic industry fields were used with the exception of those particularly noted.

Epoxy resin A: Phenol-novolak epoxy resin (epoxy equivalent 178) manufactured by Japan Epoxy Resins Co., Ltd., the trade name "154"

Epoxy resin B: Cresol-novolak epoxy resin (epoxy equivalent 210) manufactured by Dainippon Ink & Chemicals, Inc., the trade name "N-673"

Epoxy resin C: Dicyclopentadiene-modified novolak epoxy resin (epoxy equivalent 260) manufactured by Dainippon Ink & Chemicals, Inc., the trade name "HP-7200"

Epoxy resin D: Bisphenol A-type epoxy resin (epoxy equivalent 475) manufactured by Japan Epoxy Resins Co., Ltd., the trade name "1001"

Amine-type curing agent A: Dicyandiamide manufactured by Nippon Carbide Industries Co., Inc.

Organophosphorus compound A: 10-(2,5-Dihydroxyphenyl)-9,10-dihydro-9-oxa-10-phosphaphenanthrene-10-oxide manufactured by Sanko, Co., Ltd.

Organophosphorus compound B: Triphenyl phosphate manufactured by Daihachi Chemical Industry Co., Ltd.

2-Ethyl-4-methylimidazole: manufactured by Shikoku Corp., the trade name "2E4MZ"

Aluminum hydroxide: manufactured by Sumitomo Chemical Co., Ltd., the trade name "CL-303"

Zinc molybdate-treated talc: manufactured by Nippon Sherwin-Williams Co., the trade name "911C"

Properties of laminates and printed-wiring boards were evaluated in the following manner.

Flame retardancy was evaluated based on a combustion time measured using the UL-94 vertical method. The flame retardancy is classified into V-0, V-1 and HB according to the following criterion:

V-0: The average combustion time is 5 seconds or less and the maximum combustion time is 10 second or less.

V-1: The average combustion time is 10 seconds or less and the maximum combustion time is 30 seconds or less.

HB: Combustion continued longer than V-1.

Other properties of laminates such as copper foil peel strength, glass transition temperature, insulation resistance, moisture-absorbing solder heat resistance, and chemical resistance were evaluated according to JIS C6481.

The moisture-absorbing solder heat resistance was judged as follows:

○: No change was observed.

Δ: Measling or partial delamination was observed.

×: Blister was observed.

Evaluation of the curability of a varnish was based on a time (gelation time) required for a varnish to gelate when 0.5 cc of the varnish was dropped on a hot plate at 160° C. and then stirred with a stick 1 mm in diameter.

The reaction yield of the organophosphorus compound contained in a varnish was evaluated using the percentage of peak area reduction versus the peak area before the compounding of the organophosphorus compound, the percentage of the peak area reduction versus the peak area before compounding determined by internal standard high performance liquid chromatography performed under the following conditions:

Column: Reversed phase column of Type ODS-2 manufactured by GL Sciences Inc.

Developing solvent: Water/tetrahydrofuran (70/30) mixed solvent

Detector: Ultraviolet absorption photometer (280 nm)

The compatibility of an epoxy resin and an amine-type curing agent in the absence of a solvent was evaluated as follows. In the course of compounding of a resin composition, when only a solvent-soluble ingredient has been added, a part of the resulting mixture is sampled. The sample is dropped on a transparent glass plate and is dried at 160° C. for 10 minutes so that the solvent in the sample is volatilized. The resultant sample is observed at a magnification of 100 through an optical microscope. The presence of precipitates of the amine-type curing agent is visually checked.

Example 1

A resin composition for a laminate was prepared in the composition given in Table 1. The liquid temperature employed during the compounding was 35° C. After a lapse of 5 days at room temperature, a glass cloth (thickness 0.2 mm) was impregnated with the resin composition and was dried at 160° C. for 4 minutes to form a prepreg. Four prepregs prepared in the above manner were put in layers. On both sides of the layered prepregs, 18 µm-thick copper foils were arranged and then subjected to hot press molding under the conditions, a temperature of 185° C. and a pressure of 4 MPa, for 80 minutes, yielding a 0.8 mm-thick double-sided copper-clad laminate. Immediately before the preparation of the prepregs, a part of the resin composition was sampled and the gelation time, the reaction yield of the organophosphorus compound, and the compatibility of the epoxy resin and the amine-type curing agent in the absence of a solvent were measured. Further, the properties of this laminate were evaluated. The results are shown in Table 2.

Examples 2, 3

A resin composition was prepared in the same manner, that is, in the same composition and in the same process, as Example 1. The gelation time and the reaction yield of the organophosphorus compound were measured and variations thereof were checked including Example 1.

Examples 4, 5

A resin composition was prepared in the same manner as Example 1 by employing the compositions shown in Table 1 and, after a lapse of 5 days at room temperature, a laminate and a prepreg were made from the resin composition. The liquid temperature during compounding, the varnish gelation time, the reaction yield of the organophosphorus compound, the compatibility of the epoxy resin and the amine-type curing agent in the absence of a solvent, and the properties of the laminate are shown in Table 2.

Examples 6 Through 8

Among the ingredients shown in Table 1, an epoxy resin, an amine-type curing agent, a curing accelerator and an organic solvent were compounded first and were allowed to react at 100° C. for 2 hours. After cooling, an organophosphorus compound and an inorganic filler were compounded to form a resin composition. After a lapse of 5 days at room temperature, a prepreg and a laminate were made using the resin composition. The liquid temperature during compounding of the organophosphorus compound, the varnish gelation time, the reaction yield of the organophosphorus compound, the compatibility of the epoxy resin and the amine-type curing agent in the absence of a solvent, and the properties of the laminate are shown in Table 2.

Example 9

A resin composition was prepared in the same manner as Example 1 employing the composition shown in Table 1. That is, zinc molybdate-treated talc was compounded in addition to aluminum hydroxide as the inorganic filler. After a lapse of 5 days at room temperature, a prepreg and a laminate were made from the resin composition. The liquid temperature during compounding, the varnish gelation time, the reaction yield of the organophosphorus compound, the compatibility of the epoxy resin and the amine-type curing agent in the absence of a solvent, and the properties of the laminate are shown in Table 2.

Example 10

On a surface of a double-sided copper-clad laminate prepared in Example 1, a circuit (a test pattern) was formed using a subtractive process. The surfaces of the thus prepared two double-sided copper-clad laminates each having a circuit thereon were subjected to roughening by oxidization for the improvement of adhesion. Then, the double-sided copper-clad laminates were put in layer while sandwiching two prepregs therebetween. Further, two prepregs and a 18 µm-thick copper foil were put outside and were subjected to press lamination in the same manner as Example 1 to form a 6-layer printed-wiring board containing innerlayer circuits. The resulting printed-wiring board was subjected to external circuit processing, through-hole formation, resist ink printing and packing of parts using the known method. It was confirmed that this printed-wiring board could be produced in a usual manufacturing process without any problems.

Examples 11 Trough 16

In the same manner as Example 10, printed-wiring boards were produced using the prepregs and laminates prepared in Examples 4 through 9. In all cases, it was confirmed that a printed-wiring board could be produced in a usual manufacturing process without any problems.

Comparative Example 1

A resin composition was prepared in a composition which is shown in Table 1 and is the same as that employed in Example 1, by heating at 90° C. during compounding in order to accelerating dissolution of the materials used to improve working efficiency. After a lapse of 5 days at room temperature, a prepreg and a laminate were made in the same manner as Example 1. Evaluation was carried out with respect to the gelation time, the reaction yield of the organophosphorus compound, the compatibility of the epoxy resin and the amine-type curing agent in the absence of a solvent and the properties of the laminate. The results are shown in Table 2.

Comparative Example 2, 3

A resin composition was prepared in the same composition and in the same process as Comparative Example 1. The gelation time and the reaction yield of the organophosphorus compound were measured and variations thereof were checked including Comparative Example 1.

Comparative Example 4

A resin composition was prepared in the composition shown in Table 1. As an organophosphorus compound, triphenyl phosphate, which has a structure different from that represented by formula 1, was used and the temperature employed during the compounding of the resin composition was 34° C. After a lapse of 5 days at room temperature, a prepreg and a laminate were made from this resin composition. The varnish gelation time, the reaction yield of the organophosphorus compound, the compatibility of the epoxy resin and the amine-type curing agent in the absence of a solvent and the properties of the laminate were shown in Table 2.

TABLE 1

(Unit: parts by weight)

| Stock material | | Example 1 | Example 2 | Example 3 | Example 4 | Example 5 | Example 6 | Example 7 | Example 8 | Example 9 | Comparative Example 1 | Comparative Example 2 | Comparative Example 3 | Comparative Example 4 |
|---|---|---|---|---|---|---|---|---|---|---|---|---|---|---|
| Epoxy resin A | | 50.00 | 50.00 | 50.00 | | | 100.00 | | | 50.00 | 50.00 | 50.00 | 50.00 | 50.00 |
| Epoxy resin B | | | | | 50.00 | 30.00 | | 100.00 | 50.00 | | | | | |
| Epoxy resin C | | | | | | 20.00 | | | 50.00 | | | | | |
| Epoxy resin D | | 50.00 | 50.00 | 50.00 | 50.00 | 50.00 | | | | 50.00 | 50.00 | 50.00 | 50.00 | 50.00 |
| amine-type curing agent A | | 3.65 | 3.65 | 3.65 | 3.24 | 3.07 | 5.31 | 4.50 | 4.07 | 3.65 | 3.65 | 3.65 | 3.65 | 3.65 |
| Organo-phosphorus compound | A | 14.94 | 14.94 | 14.94 | 14.88 | 14.86 | 15.14 | 15.02 | 14.96 | 14.94 | 14.94 | 14.94 | 14.94 | |
| | B | | | | | | | | | | | | | | 15.03 |
| 2-methoxy-ethanol | | 97.59 | 97.59 | 97.59 | 97.21 | 97.05 | 98.88 | 98.12 | 97.71 | 90.09 | 97.59 | 97.59 | 97.59 | 85.33 |
| 2E4MZ | | 0.30 | 0.30 | 0.30 | 0.30 | 0.30 | 0.01 | 0.01 | 0.01 | 0.30 | 0.30 | 0.30 | 0.30 | 0.30 |
| Aluminum hydroxide | | 79.26 | 79.26 | 79.26 | 78.95 | 78.82 | 80.30 | 76.69 | 79.36 | 54.87 | 79.26 | 79.26 | 79.26 | 69.30 |
| 911C | | | | | | | | | | 9.15 | | | | |

TABLE 2

(Unit: parts by weight)

| | Property | Example 1 | Example 2 | Example 3 | Example 4 | Example 5 | Example 6 | Example 7 |
|---|---|---|---|---|---|---|---|---|
| Resin composition | Gelation time (s) | 280 | 278 | 282 | 320 | 350 | 184 | 196 |
| | (standard deviation) | — | 1.63 | — | — | — | — | — |
| | Compounding temperature (° C.) | 35 | 37 | 35 | 34 | 32 | 38 | 37 |
| | Reaction yield (%) | 0.13 | 0.14 | 0.11 | 0.09 | 0.08 | 0.12 | 0.09 |
| | Precipitation of amine-type curing agent | None | None | None | None | None | None | None |
| Laminate | Flame retardancy (UL 94) | V-0 | — | — | V-0 | V-0 | V-0 | V-0 |
| | Copper foil peel strength (Nk/m) | 1.42 | — | — | 1.48 | 1.57 | 1.40 | 1.45 |
| | Glass transition temperature (° C.) | 134 | — | — | 131 | 139 | 158 | 162 |
| | Insulation resistance (Ω) Normal | $6.4 \times 10^{13}$ | — | — | $5.2 \times 10^{13}$ | $7.2 \times 10^{13}$ | $4.1 \times 10^{13}$ | $4.5 \times 10^{13}$ |
| | Boiled (for 2 h) | $9.8 \times 10^{11}$ | — | — | $2.1 \times 10^{11}$ | $3.5 \times 10^{11}$ | $8.8 \times 10^{11}$ | $9.5 \times 10^{11}$ |
| | Moisture-absorbing solder heat resistance* | ○○○ | — | — | ○○○ | ○○○ | ○○○ | ○○○ |
| | Chemical resistance Appearance (JIS)** | Fine | — | — | Fine | Fine | Fine | Fine |
| | Weight decrease (%)*** | 0.05 | — | — | 0.06 | 0.03 | 0.04 | 0.08 |

| | | Property | Example 8 | Example 9 | Comparative Example 1 | Comparative Example 2 | Comparative Example 3 | Comparative Example 4 |
|---|---|---|---|---|---|---|---|---|
| Resin composition | | Gelation time (s) | 207 | 184 | 198 | 261 | 172 | 315 |
| | | (standard deviation) | — | — | — | 37.37 | — | — |
| | | Compounding temperature (° C.) | 38 | 35 | 90 | 91 | 90 | 34 |
| | | Reaction yield (%) | 0.08 | 0.12 | 7.31 | 3.52 | 8.22 | 0.01 |
| | | Precipitation of amine-type curing agent | None | None | None | None | None | None |
| Laminate | | Flame retardancy (UL 94) | V-0 | V-0 | V-0 | — | — | V-0 |
| | | Copper foil peel strength (Nk/m) | 1.53 | 1.31 | 1.37 | — | — | 1.45 |
| | | Glass transition temperature (° C.) | 163 | 131 | 133 | — | — | 124 |
| | | Insulation resistance (Ω) Normal | $5.7 \times 10^{13}$ | $6.2 \times 10^{13}$ | $5.8 \times 10^{13}$ | — | — | $6.5 \times 10^{13}$ |
| | | Boiled (for 2 h) | $1.2 \times 10^{11}$ | $8.2 \times 10^{11}$ | $8.9 \times 10^{11}$ | — | — | $6.4 \times 10^{11}$ |
| | | Moisture-absorbing solder heat resistance* | ○○○ | ○○△ | ○○○ | — | — | ○○X |
| | | Chemical resistance Appearance (JIS)** | Fine | Fine | Fine | — | — | Fine |
| | | Weight decrease (%)*** | 0.05 | 0.04 | 0.03 | — | — | 2.85 |

*Treated in Pressure-cooker at 121° C. for 4 hours, then immersed in solder bath at 260° C. for 20 seconds
**Immersed in 3% Sodium hydroxide at 40° C. for 3 minutes
***Immersed in 2% Sodium hydroxide at 90° C. for 2 hours From Table 2, it has been confirmed that in all of the Examples illustrated can be obtained laminates having favorable properties including favorable moisture-absorbing solder heat resistance, copper foil peel strength, glass transition temperature and insulation resistance while maintaining enough flame retardancy. Especially, in Examples 6 through 8, excellent properties of laminates are obtained. Further, the comparison of the gelation time in Examples 1 through 3 with that in Comparative Examples 1 through 3 confirms that the resin compositions of the Examples exhibit smaller standard deviations with respect to the gelation time and the curabilities of the resins are more stable. On the other hand, in Comparative Examples 1 through 3, which employed a temperature as high as 90° C. during compounding, the standard deviation of gelation time is larger and the curability is unstable. Furthermore, in Comparative Example 4 where the organophosphorus compound that does not have the structure of the present invention was added, the moisture-absorbing solder heat resistance does not satisfy the desired characteristics.

As described above, the resin composition of the present invention has enough flame retardancy without containing any halogen-containing flame retarder and has good heat resistance and good chemical resistance. Additionally, the resin composition causes no problems concerning reaction stability or curability caused by consumption of an epoxy resin through a reaction occurring during compounding of the resin. Laminates prepared using the resin composition have good properties.

What is claimed is:

1. A resin composition comprising:
   an epoxy resin,
   an amine-type curing agent,
   an organophosphorous compound having a structure represented by formula 1:

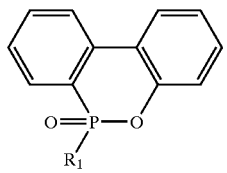

Formula 1 wherein $R_1$ is an aryl radical with two hydroxyl groups, and the aryl radical can be substituted by one to three lower alkyls, and
   an organic solvent;
   wherein the resin composition has been compounded at a temperature of 50° C. or lower, so as to inhibit reaction of said epoxy resin and said organophosphorous compound in the resin composition during compounding.

2. The resin composition according to claim 1, wherein the epoxy resin contains at least one epoxy resin selected from a phenol-novolak epoxy resin, a cresol-novolak epoxy resin and a dicyclopentadiene-modified novolak epoxy resin in an amount of 30 wt % or more versus the combined amount of the whole epoxy resin.

3. The resin composition according to claim 1 or 2, wherein the amount of the amine-type curing agent compounded is from 0.3 to 0.6 equivalent per epoxy group of the epoxy resin.

4. The resin composition according to claim 3, further comprising at least one inorganic filler in an amount of from 10 to 50 wt % versus the total amount of the solid components excluding the organic solvent.

5. The resin composition according to claim 2, further comprising at least one inorganic filler in an amount of from 10 to 50 wt % versus the total amount of the solid components excluding the organic solvent.

6. The resin composition according to claim 2, wherein the amine-type curing agent is dicyanamide.

7. The resin composition according to claim 6, further comprising at least one inorganic filler in an amount of from 10 to 50 wt % versus the total amount of the solid components excluding the organic solvent.

8. The resin composition according to claim 6, wherein the organophosphorous compound is 10-(2,5-dihydroxyphenyl)-9, 10-dihydro-9-oxa-10-phosphaphenanthrene-10-oxide.

9. The resin composition according to claim 8, further comprising at least one inorganic filler in an amount of from 10 to 50 wt % versus the total amount of the solid components excluding the organic solvent.

10. The resin composition according to claim 9, wherein the inorganic filler is aluminum hydroxide.

11. The resin composition according to claim 10, wherein a part of the inorganic filler is treated with zinc molybdate.

12. The resin composition according to claim 11, wherein the amount of the amine-type curing agent compounded is from 0.3 to 0.6 equivalent per epoxy group of the epoxy resin.

13. The resin composition according to claim 12, wherein the amount of the organophosphorous compound compounded is from 5 to 30 wt % versus the total amount of organic solids excluding the organic solvent.

14. A prepreg obtainable by impregnating a substrate with the resin composition according to claim 11 and then drying the substrate impregnated with the resin composition.

15. A laminate comprising at least one prepreg according to claim 14 and at least one metal foil.

16. A printed wiring board comprising the laminate according to claim 15, wherein an unnecessary part of the laminate has been removed by etching.

17. The resin composition according to claim 1, wherein the amine-type curing agent is dicyanamide.

18. The resin composition according to claim 17, further comprising at least one inorganic filler in an amount of from 10 to 50 wt % versus the total amount of the solid components excluding the organic solvent.

19. The resin composition according to claim 1, wherein the amount of the organophosphorous compound compounded is from 5 to 30 wt % versus the total amount of organic solids excluding the organic solvent.

20. The resin composition according to claim 19, further comprising at least one inorganic filler in an amount of from 10 to 50 wt % versus the total amount of the solid components excluding the organic solvent.

21. The resin composition according to claim 20, wherein the inorganic filler is aluminum hydroxide.

22. The resin composition according to claim 1, wherein the organophosphorous compound is 10-(2,5-dihydroxyphenyl)-9, 10-dihydro-9-oxa-10-phosphaphenanthrene-10-oxide.

23. The resin composition according to claim 22, further comprising at least one inorganic filler in an amount of from 10 to 50 wt % versus the total amount of the solid components excluding the organic solvent.

24. The resin composition according to claim 1, further comprising at least one inorganic filler in an amount of from 10 to 50 wt % versus the total amount of the solid components excluding the organic solvent.

25. The resin composition according to claim 24 wherein the inorganic filler is aluminum hydroxide.

26. The resin composition according to claim 24 or 25 wherein a part of the inorganic filler is treated with zinc molybdate.

27. A prepreg obtainable by impregnating a substrate with the resin composition according to claim 1 or 24 and then drying the substrate impregnated with the resin composition.

28. A laminate comprising at least one prepreg according to claim 27 and at least one metal foil.

29. A printed wiring board comprising the laminate according to claim 28, wherein an unnecessary part of the laminate has been removed by etching.

30. The resin composition according to claim 1, wherein the reaction of said epoxy resin and said organophosphorous compound is inhibited such that a ratio of amount of organophosphorous compound that has reacted with the epoxy resin to the amount of unreacted organophosphorous compound is at most 0.5%.

31. A method for producing a resin composition comprising the step of compounding the following components:

an epoxy resin, an amine-type curing agent, an organophosphorous compound having a structure represented by formula 1:

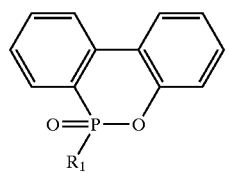

Formula 1 wherein $R_1$ is an aryl radical with two hydroxyl groups, and the aryl radical can be substituted by one to three lower alkyls, and an organic solvent;

wherein the compounding step is performed at a temperature of 50° C. or lower, so as to inhibit reaction of said epoxy resin and said organophosphorous compound in the resin composition during compounding.

32. The method for producing a resin composition according to claim 31, wherein the resin composition further comprises an inorganic filler.

33. A method for producing a resin composition comprising the steps of:

reacting an epoxy resin with an amine-type curing agent in an organic solvent at a temperature of from 80 to 140° C. to form a reaction product, whereby bringing the epoxy resin and the amine-type curing agent into a state where they are mutually compatible in the absence of a solvent;

compounding an organophosphorous compound and said reaction product at a temperature of 50° C. or lower, so as to inhibit reaction of said reaction product and said organophosphorous compound in the resin composition during compounding;

wherein said organophosphorous compound has a structure represented by formula 1:

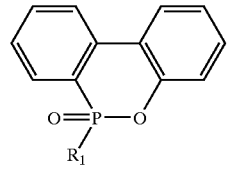

Formula 1 wherein $R_1$ is an aryl radical with two hydroxyl groups, and the aryl radical can be substituted by one to three lower alkyls.

34. The method for producing a resin composition according to claim 33, wherein the resin composition further comprises an inorganic filler.

35. A method for producing a prepreg, the method comprising:

using a resin composition prepared by the method according to claim 31 or 33 as resin varnish, impregnating a substrate with this resin varnish, and then drying the substrate impregnated with the resin varnish.

36. A method for producing a laminate, the method comprising arranging at least one metal foil on at least one prepreg prepared by the method according to claim 35, and heating and pressuring them to laminate together.

37. A method for producing a printed-wring board, the method comprising removing, by etching, an unnecessary part of the laminate prepared by the method according to claim 36.

* * * * *